(12) United States Patent
Alzaher

(10) Patent No.: US 8,508,291 B1
(45) Date of Patent: Aug. 13, 2013

(54) DIGITALLY PROGRAMMABLE ACTIVE-RC FILTER

(75) Inventor: Hussain Alzaher, Dhahran (SA)

(73) Assignees: Kind Fahd University of Petroleum and Minerals, Dhahran (SA); King Abdulaziz City of Science and Technology, Riyadh (SA)

(*) Notice: Subject to any disclaimer, the term of this patent is extended or adjusted under 35 U.S.C. 154(b) by 0 days.

(21) Appl. No.: 13/437,746

(22) Filed: Apr. 2, 2012

(51) Int. Cl.
*H03B 1/00* (2006.01)

(52) U.S. Cl.
USPC .......................................... 327/553

(58) Field of Classification Search
USPC ................................. 327/551–559
See application file for complete search history.

(56) References Cited

U.S. PATENT DOCUMENTS

| | | | | |
|---|---|---|---|---|
| 5,953,305 | A | * | 9/1999 | Jeong .............................. 327/552 |
| 6,556,078 | B2 | * | 4/2003 | Buescher et al. ............... 330/85 |
| 2006/0186952 | A1 | | 8/2006 | Lou et al. |

OTHER PUBLICATIONS

*A digitally programmable highly linear active-RC filter*, Alzaher, Mixed Design of Integrated Circuits & Systems, Jun. 25-27, 2009, pp. 588-591 (B).
*A CMOS highly linear channel-select filter for 3G multistandard integrated wireless receivers*, Alzaher et al., IEEE Journal of Solid-State Circuits, Jan. 2002, vol. 37 Issue: 1, pp. 27-37.

* cited by examiner

*Primary Examiner* — Lincoln Donovan
*Assistant Examiner* — Sibin Chen
(74) *Attorney, Agent, or Firm* — Richard C. Litman

(57) ABSTRACT

The digitally programmable active-RC filter provides an active-RC filter having programmable time constants. An inherently linear current division network (CDN) provides the programmable time constants while preserving a high linearity property of the active-RC filter. Using this approach, wide tuning characteristics are achieved. The programmable active-RC filter uses two op-amps per integrator. Cross-coupling two of the units configured with I and Q inputs provides the reconfigurable filter with a complex bandpass and normal lowpass response. One embodiment is formed as a fourth-order filter fabricated in a standard 0.18 μm CMOS process. The complex and lowpass filters achieve in-band spurious-free dynamic ranges (SFDRs) of about 70 dB and 71 dB for bandwidths of 1 MHz and 5.5 MHz, respectively.

5 Claims, 8 Drawing Sheets

DIGITALLY PROGRAMMABLE ACTIVE-RC FILTER

BACKGROUND OF THE INVENTION

1. Field of the Invention

The present invention relates to analog filter circuits, and particularly to a digitally programmable active-RC filter.

2. Description of the Related Art

Active-RC (resistor-capacitor) filters based on operational amplifiers (op-amps) offer the highest dynamic range among the different filtering techniques. This is mainly due to their superior linearity compared with other techniques. However, the lack of efficient programmability features hinders their wide use in integrated circuits (ICs), wherein tuning properties are essential to compensate for process, component and temperature variations. The MOSFET-C approach was suggested to provide the missing tuning property, but it suffers from poor linearity, and hence limited dynamic range. Also, its tuning range is limited, particularly for low power supply voltages.

Digitally programmable devices are attractive for mixed digital-analog applications. The digital tuning property allows direct interfacing with the digital signal processing (DSP) part available in most modern systems, providing power-efficient design solution. Banks of resistors and/or capacitors can be employed in active-RC filters to offer the programmability feature. However, they occupy relatively large silicon area. In addition, the switching transistors (quasi-static switches) within the banks are associated with finite non-linear resistances.

Thus, a digitally programmable active-RC filter solving the aforementioned problems is desired.

SUMMARY OF THE INVENTION

The digitally programmable active-RC filter provides an active-RC filter having digitally programmable time constants. An inherently linear current division network (CDN) provides the programmable time constant, while preserving a high linearity property of the active-RC filter. Using this approach, wide tuning characteristics are achieved. The programmable active-RC filter uses two op-amps and a CDN per integrator.

Cross-coupling two of the units configured with I (in-phase) and Q (quadrature) paths provides the reconfigurable filter with a complex bandpass and normal lowpass response. A preferred embodiment is formed from a fourth-order filter fabricated in a standard 0.18 μm CMOS process. The complex and lowpass filters achieve in-band spurious-free dynamic ranges (SFDRs) of about 70 dB and 71 dB for bandwidths of 1 MHz and 5.5 MHz, respectively.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
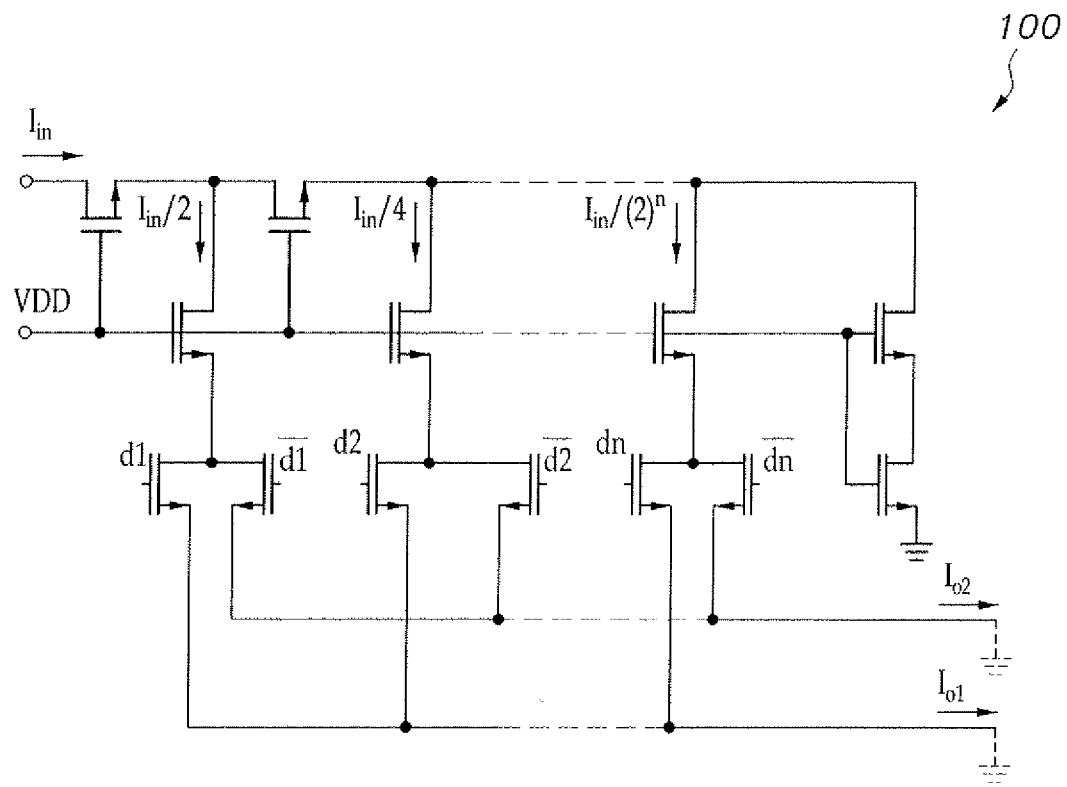
FIG. 1 is a detailed schematic diagram of a current division network (CDN) circuit.
Figure 2:
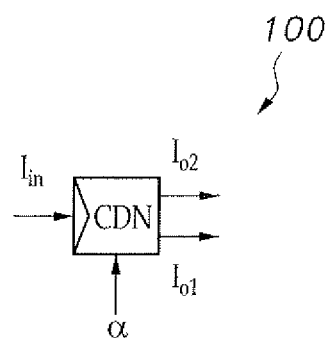
FIG. 2 is a schematic symbol representing the CDN of FIG. 1.

The digitally programmable active-RC filter provides an active-RC filter having digitally programmable time constants. An inherently linear current division network (CDN) 100, shown in FIGS. 1 and 2, provides the programmable time constants while preserving a high linearity property of the active-RC filter. Using this approach, wide tuning characteristics are achieved. An exemplary programmable active-RC filter 300 (shown in FIG. 3) uses two op-amps per integrator.

Cross-coupling two of the units configured with I (in-phase) and Q (quadrature) paths provides the reconfigurable filter with a complex bandpass and normal lowpass response. A preferred embodiment is formed from a fourth-order filter fabricated in a standard 0.18 μm CMOS process. The complex and lowpass filters achieve in-band spurious-free dynamic ranges (SFDRs) of about 70 dB and 71 dB for bandwidths of 1 MHz and 5.5 MHz, respectively.

The exemplary current division network (CDN) 100, shown in detail in FIG. 1, has an abbreviated schematic notation, as shown in FIG. 2. As shown, the CDN 100 has an input current $I_{in}$, a digital control, $\alpha$, and two output currents, $I_{o1}$ and $I_{o2}$, respectively. The digital control, $\alpha$, may be a user selectable digital word input from an input circuit containing a microprocessor, microcontroller, digital signal processor, or the like, which controls the current output of the CDN 100. Unlike the case of arrays, the CDN 100 has the advantage that the switching transistors are an original part of the circuit structure. Therefore, dimensions of these transistors are selected to be small without affecting the linearity.

Moreover, the CDN 100 is suitable for low power operation, since it does not dissipate standby current. It can be shown that the input current of the CDN 100 is binary weighted through different branches. With all transistors of the CDN 100 selected of equal dimensions (W/L), the output current can be expressed as:

$$I_{out} = I_{in} \Sigma_{i=1}^{n} d_i 2^{-i} = \alpha I_{in} \quad (1)$$

where $\alpha$ represents the division ratio, $d_i$ is the i-th digital bit and n is the size of a control word.

Figure 9A:
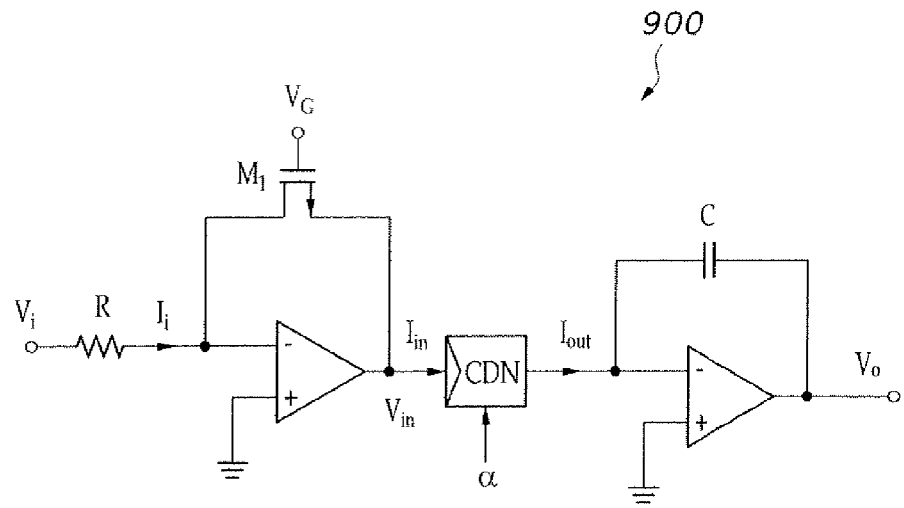
FIG. 9A shows a first integrator to be used in deriving a transfer function used in the digitally programmable active-RC filter according to the present invention.
Figure 9B:
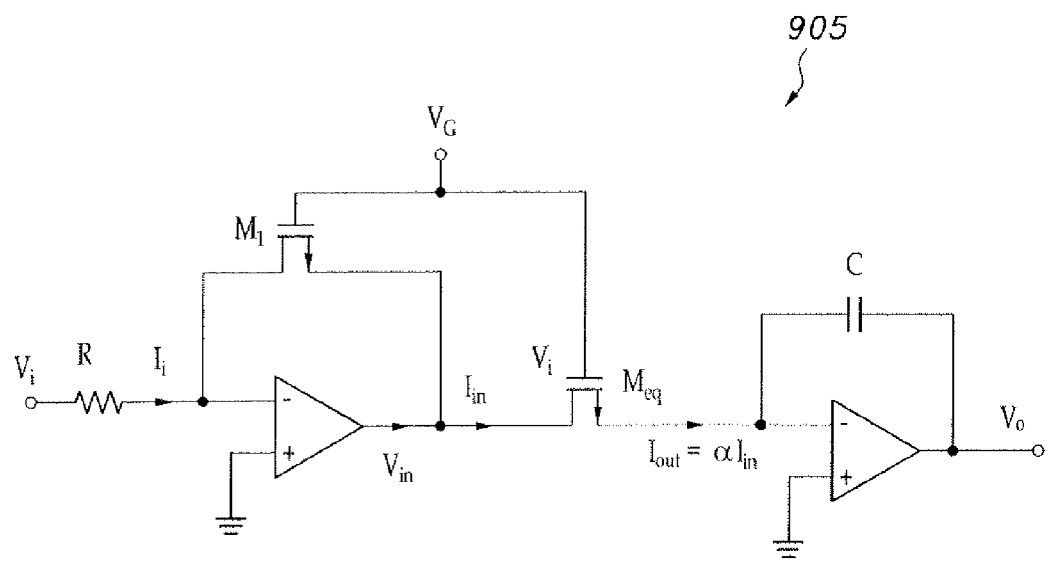
FIG. 9B shows a simplified equivalent circuit of the first integrator shown in FIG. 9A.

FIGS. 9A and 9B show exemplary lossless integrator circuits that incorporate the CDN 100 of FIGS. 1 and 2. The operation and advantages of the CDN 100 cited above only hold if it is derived by current and its output terminal is kept at virtual ground. The first condition is satisfied through the use of the first op-amp of FIG. 9A with a feedback transistor ($M_1$) playing the role of a voltage-to-current converter. The second requirement is fulfilled by connecting the output terminal of the CDN to the inverting input of the second op-amp of the active-RC filter 300, which is configured as an integrator. The operation of the integrator circuit 900 can be explained as follows. First, it can be shown using the principle of series and parallel-combination of MOSFETs that the CDN transistors can be combined into a single transistor $M_{eq}$ with a dimension of 0.5 W/L for any control word combination. Second, note that the voltage at the CDN input node ($V_{in}$) is a non-linear function of the current $I_{in}$. But replacing the CDN 100 by its equivalent transistor ($M_{eq}$, shown in FIG. 9B) highlights the fact that $M_1$ and $M_{eq}$ have the same terminal voltages $V_G$, $V_{in}$ and virtual grounds. Therefore, the graphical representation of the general MOS transistor model can be used to show that apart from the aspect ratios of $M_1$ and $M_{eq}$, the current flowing through $M_1(I_t)$ and that of the CDN ($-I_{in}$) are equivalent. This results in the following transfer function when the size of $M_1$ is selected as 0.5 W/L:

$$\frac{V_o(s)}{V_i(s)} = \frac{1}{s\frac{CR}{\alpha}} \quad (2)$$

This means that the proposed circuit represents a non-inverting lossless integrator with digitally programmable time constant $\tau = CR/\alpha$. The tuning range of the time constant can be further increased by utilizing both output terminals of the CDN 100, as shown in the digitally programmable active-RC filter circuit 300 in FIG. 3. One output ($I_{o2}$) of the CDN is used in the feedback path of the first op-amp, and other output ($I_{o1}$) is used to feed the capacitor. It can be shown that the transfer function of the proposed integrator will be given by:

$$\frac{V_o(s)}{V_i(s)} = \frac{\sum_{i=1}^{n} d_i 2^{-i}}{\sum_{i=1}^{n} \bar{d}_i 2^{-i}} \frac{1}{sCR} = \frac{\alpha}{(1-\alpha)sCR} = \frac{1}{s\frac{CR}{\beta}} \quad (3)$$

where $\beta = \alpha(1-\alpha)$.

Figure 4:
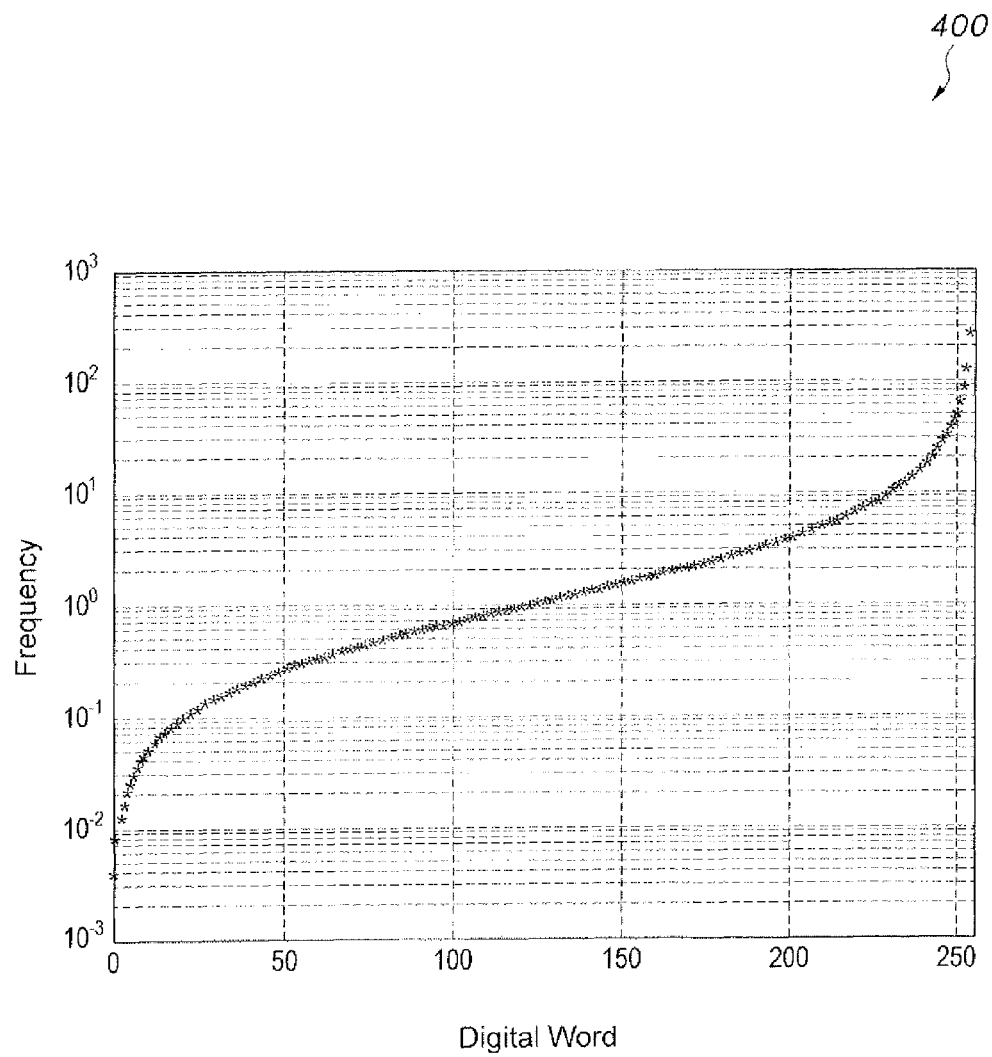
FIG. 4 is a normalized integrator frequency plot of the digitally programmable active-RC lossless integrator of FIG. 3.

The frequency plot 400 of FIG. 4 shows the programmability of the integrator frequency $\omega_{int} = 1/\tau$ for the two integrators after normalization using 8-bit CDNs. It can be seen that $\omega_{int}$ of the digitally programmable active-RC filter 300 can be programmed to cover about five decades. This extra wide tuning range would require a passive elements change of about 64,000 times. Moreover, it is expected that the digitally programmable active-RC filter 300 will be associated with better linearity performance than prior art integrators. Although the CDN 100 is inherently linear, independent of region of operation and second-order effects, statistical mismatches of transistors may influence the robustness of the CDN linearity. Mismatches in device geometry or oxide thickness of the CDN transistors only affect the accuracy of the division (error in the value of beta) and do not contribute distortion. In filter design, these errors will result in deviations in the filter parameters from their nominal values. But this is not an issue in the presence of a tuning feature that is intended to compensate for this type of error. However, a mismatch in threshold voltage ($V_T$) may cause some distortion. Thus, optimum linearity is achieved when the devices operate with a large effective gate-source voltage.

It is known that an arbitrary lowpass filter can be converted to a bandpass complex filter centered at $\omega_c$ when every frequency dependent element in the LPF is modified to be a function of $s-j\omega_c$ instead of s. In the case of transforming a normal integrator to its polyphase counterpart, a complex feedback loop is realized by cross-coupling between the in-phase (I) and quadrature (Q) paths, as shown in the cross-coupling branches 502a and 502b of the digitally programmable active-RC filter circuit 500 of FIG. 5. It can be shown that the transfer characteristics are given by:

$$H_{CI}(s) = \frac{V_{oI}(s)}{V_I(s)} = \frac{V_{oQ}(s)}{V_Q(s)} = \frac{1}{\left(s - j\frac{\beta}{CR_c}\right)\frac{CR}{\beta}} \quad (4)$$

Thus, the time constant of the complex integrator is same as the original integrator, while $\omega_c = \beta/CR_c$.

Although adopting RC banks is a simple method for providing tuning in integrated circuit (IC) applications, they are associated with relatively large area, with limited tuning range, and with low tuning resolution. For example, the tuning range of the proposed integrator would require changes of the passive elements values of about 64,000 times. In addition, the static switches involved in RC banks are inherently non-linear, limiting the linearity of the overall filter.

The non-linearity of MOSFET switches has been analytically addressed in the prior art. To maintain high linearity for filters adopting RC banks incorporating such a switch, the non-linear triode region resistance of the MOSFETs must be kept as small as possible. This is achieved by using transistors with relatively large widths and minimum gate length, as well as by driving the transistors by the largest possible gate-source voltage. The tradeoffs between the linearity of a transition gate switch (which consists of a parallel combination of NMOS and PMOS) and its area is investigated. The switch is biased with maximum gate voltages (i.e., $V_{DD}$ for NMOS and $V_{SS}$ for PMOS) and connected in series with a passive resistance with a value of 18.7 kΩ. Third-order intermodulation (IM3) tests were performed for several values of switch resistances, depending on the transistor sizing. The third-order-intercept point (IP3) measurements were recorded for IM3 signals at 600 kHz. Since the switch resistance is always much smaller than that of the passive resistance, the voltage transfer ratio between the output and the input is almost unity for all cases, which results in OIP3≈IIP3.

It is shown that the linearity improves as the switch resistance is decreased. It can be seen that when the resistance of the switch is 10% of the passive resistance, IP3 is limited to 21 dB. However, it improves to about 42 dB when the ratio becomes 0.02%, or equivalently, when the W/L of the switching transistors is about 100 µm/0.18 µm. Given that the size of the CDN transistors is 0.9 µm/0.181 µm and that there are 32 transistors in a CDN of 8-bits, it is can be concluded that the size of a single transmission gate would be as large as 7 CDNs. Hence, if the total number of switches in all the banks and the area that would be occupied by the passive components in each bank are taken into account, it can be concluded that the required area of RC banks would be relatively very large.

The programmability feature of the proposed approach is obtained via using an additional op-amp per integrator, which mainly results in increased power consumption. Other solutions include the use of a MOSFET-C-based integrator. The simplest case of the MOSFET-C technique is to replace each passive resistor with a MOS transistor working in the triode region. In such a case, even non-linearity can be cancelled through fully differential structures. However, odd harmonics and intermediation products would limit the linearity of the circuits. In fact, it is expected that the linearity of such circuits would be worse than those with resistor banks, since there would be no passive resistors in combination with these transistors. Even and odd harmonics can be canceled using a MOSFET-C integrator, but it requires the use of two op-amps. In general, MOSFET-C filters exhibit limited linearity and tuning range, particularly for low supply voltages.

Figure 3:
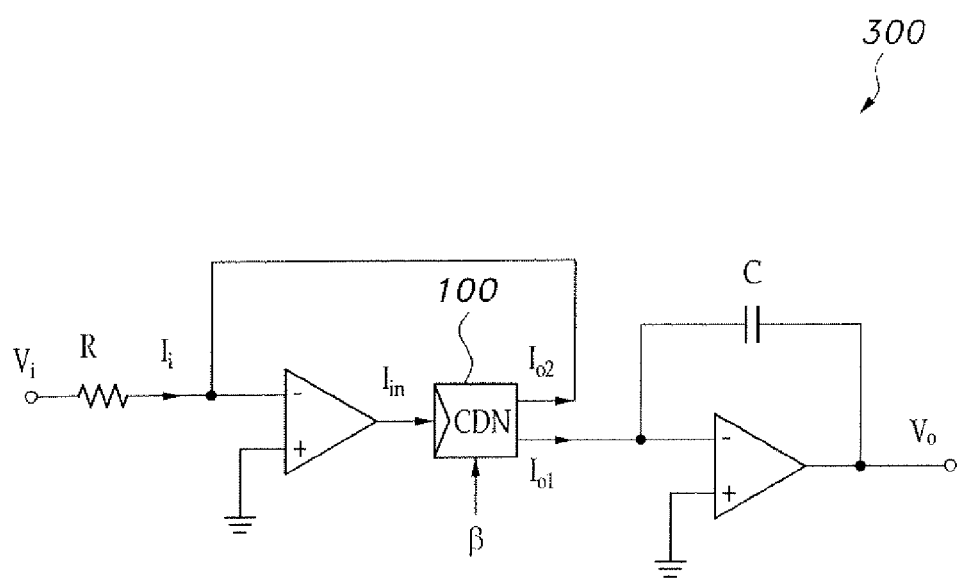
FIG. 3 is a schematic diagram of a first embodiment of a digitally programmable active-RC filter according to the present invention, featuring a lossless integrator circuit using the CDN of FIG. 1.
Figure 6:
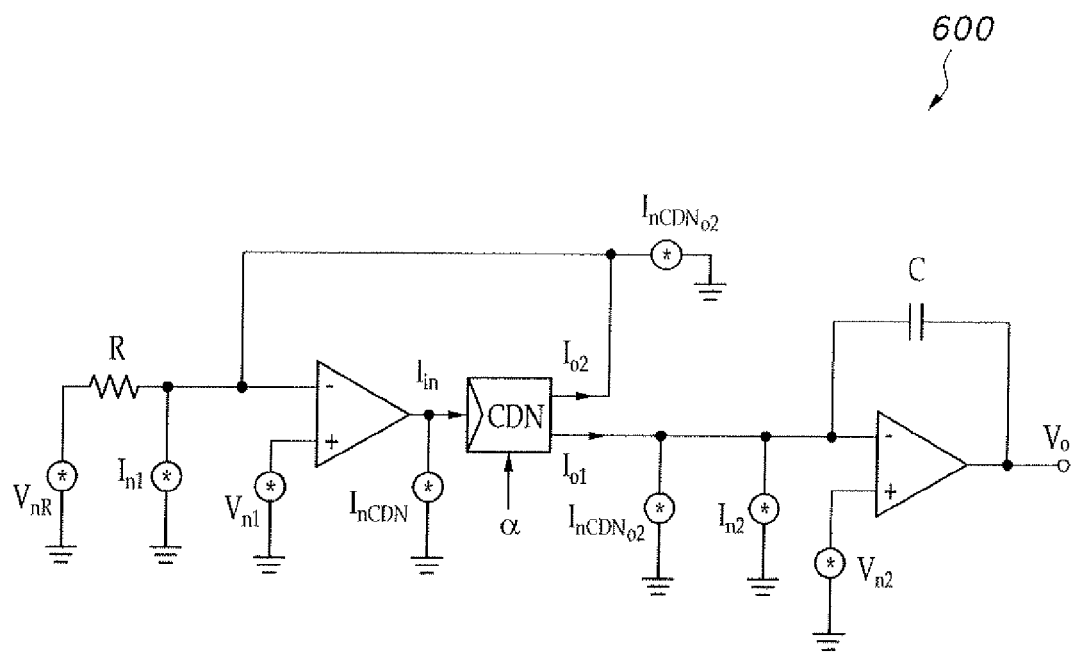
FIG. 6 is an equivalent noise mode schematic diagram of the active-RC filter of FIG. 3.

The equivalent noise mode circuit 600 of FIG. 6 details the equivalent noise mode of the digitally programmable active-RC integrator 300 of FIG. 3. Noise of the passive resistor is modeled as a voltage source whose spectral density function is $V_{nR}^2 = 4kTR$, where k is Boltzmann's constant, T is absolute temperature, and R is resistance value. Noise of the op-amps is modeled using two uncorrelated input-referred sources, a voltage source (with spectral density of $V_n^2$ in series with the non-inverting terminal), and a current source (with spectral density of $I_n^2$ injected at the inverting input of the op-amp). The internal thermal noise of the CDN can be modeled as a current source ($I_{nCDN}^2$) at the input terminal and two noise sources at the output terminals ($I_{nCDNo1}^2$ and $I_{nCDNo2}^2$). The total output voltage noise is determined as:

$$V_{no}^2 = \left|\frac{\alpha}{1-\alpha}\frac{1}{sCR}\right|^2 (V_{nR}^2 + V_{n1}^2) + \left|1 + \frac{1}{sCr_{CDN1}}\right|^2 V_{n2}^2 + \left|\frac{\alpha}{1-\alpha}\frac{1}{sCR}\right|^2 (I_{n1}^2 + I_{nCDNo2}^2) + \left|\frac{1}{sC}\right|^2 (I_{nCDNo1}^2 + I_{n2}^2) \quad (5)$$

where $r_{CDN1}$ is the small signal resistance of the part of the CDN used in the forward path. Practically, the noise contribution of the current sources can be neglected, since typical values of op-amp noise currents $I_{n1}$ and $I_{n2}$ are about 0.1 pA/√Hz and $V_n$ is about 10 nV/√Hz. Similarly, the noise contribution of the CDN can be neglected, since the CDN is basically equivalent to a single transistor.

Thus, the output noise of the digitally programmable active-RC integrator can be approximated as:

$$V_{no}^2 = \left|\frac{\alpha}{1-\alpha}\frac{1}{sCR}\right|^2 (V_{nR}^2 + V_{n1}^2) + \left|1 + \frac{1}{sCr_{CDN1}}\right|^2 V_{n2}^2 \quad (6)$$

On the other hand, by neglecting the contribution of the current noise source of the op-amp, the noise of Miller's integrator can be expressed as:

$$V_{nMiller}^2 \approx \left|\frac{1}{sC}\right|^2 V_{nR}^2 + \left|1 + \frac{1}{sCR}\right|^2 V_n^2 \quad (7)$$

For equal $\omega_{int} = 1/CR$ (i.e., $\alpha = 0.5$) and using C=5 pF, R=18.7 kΩ, the root noise spectral density of the proposed integrator is just slightly more than that of Miller's integrator. For example, the noise measured at $\omega_{int}$ is found to be approximately 28 nV/√Hz and 26 nV/√Hz for the active-RC filter 300 and Miller's integrators, respectively. This is equivalent to only about 0.64 dB increase in the noise performance. Evaluating (6) and (7) (assuming $r_{CDN2}=R$, as in the case of AC analysis, gives respective noise of approximately 25 nV/√Hz and 23 nV/√Hz.

Figure 7:
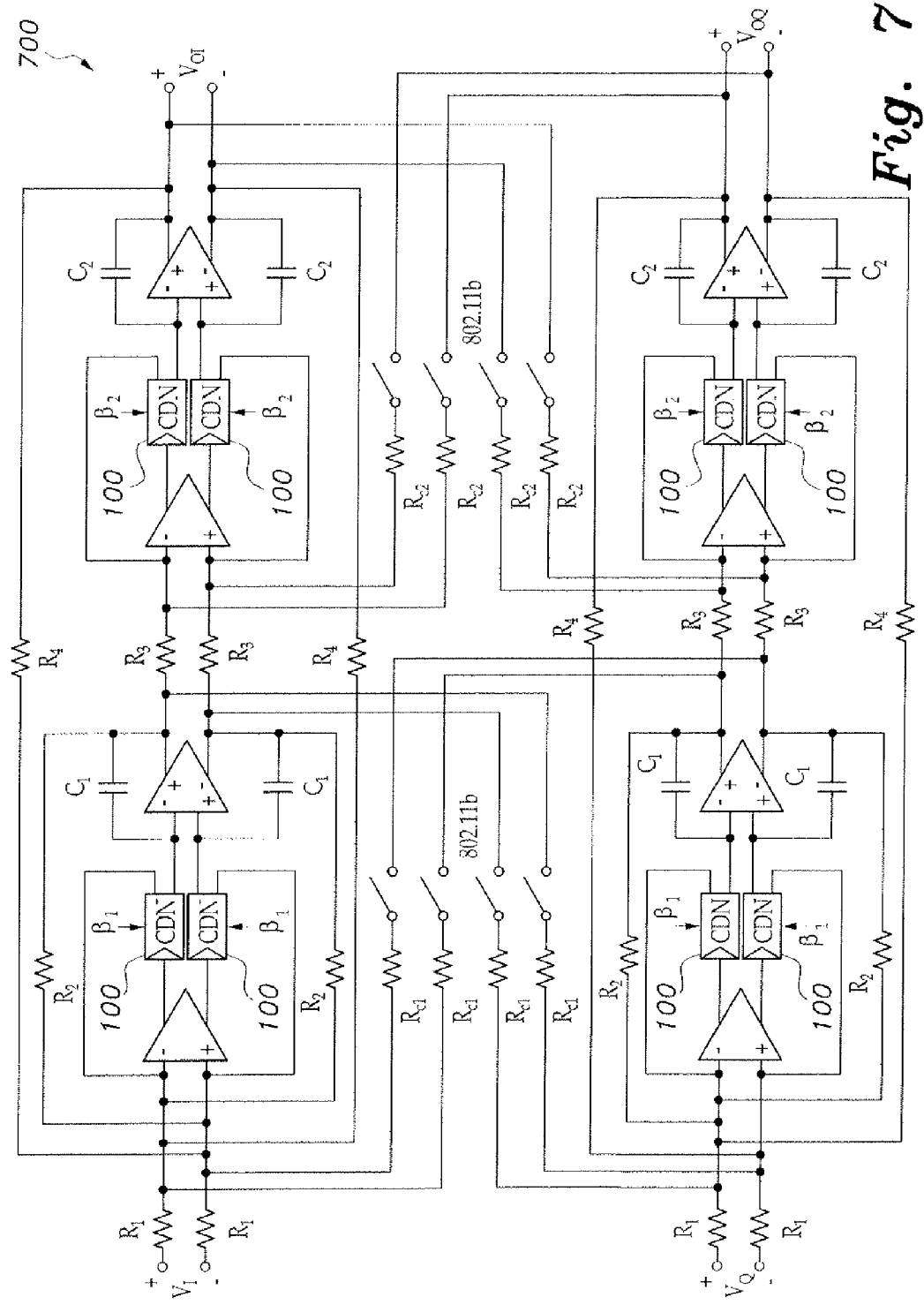
FIG. 7 is a third embodiment of a digitally programmable active-RC filter according to the present invention, featuring a complex reconfigurable biquad filter using the circuit of FIG. 5.

The digitally programmable active-RC filter may be implemented as a fully differential reconfigurable filter circuit 700, as shown in FIG. 7. In the Bluetooth® (BT) mode, the filter 700 operates as a complex filter to attenuate the strong image signals, while it operates as normal lowpass filter in 802.11b mode. Switching between the two modes is achieved by using switches in the cross-coupling connections. It can be shown that the general transfer function for the complex response is given by equation (8) below, wherein $\omega_{c1}=\beta_1/C_1R_{c1}$ and $\omega_{c2}=\beta_2/C_2R_{c2}$. When $\omega_{c1}=\omega_{c2}=\omega_c$, the desired complex transfer function is obtained as given by equation (9) below. Hence, the filter exhibits center frequency, pole frequency and pole quality factor and center frequency gain of:

$$\omega_c = \frac{\beta}{CR_c} \quad (10)$$

$$\omega_o = \frac{\beta}{C\sqrt{R_3 R_4}} \quad (11)$$

$$Q_o = \frac{\omega_o}{BW} = \frac{R_2}{\sqrt{R_3 R_4}} \quad (12)$$

$$H_o = \frac{R_4}{R_1} \quad (13)$$

Also, note that the bandwidth of the complex filter is $2\omega_o$. When the switches are opened, the filter is reconfigured as a normal lowpass biquad with the following transfer function:

$$H_{LP}(s) = \frac{\beta^2/(C^2 R_1 R_3)}{s^2 + s\beta/(CR_2) + \beta^2/(C^2 R_3 R_4)} \quad (14)$$

The main parameters of the filter, namely pole frequency, pole quality factor and lowpass gain, are given by equations (11) through (13), respectively. Since the parameters $\omega_c$ and $\omega_o$ are function of RC products, the programmability feature must be adopted for their tuning. These parameters can be tuned without disturbing $Q_o$ and $H_o$ through the adjustment of $\beta=\beta_1=\beta_2$. On the other hand, $H_o$ and $Q_o$ can be implemented precisely in ICs, as they are functions of resistor and/or capacitor ratios.

Figure 5:
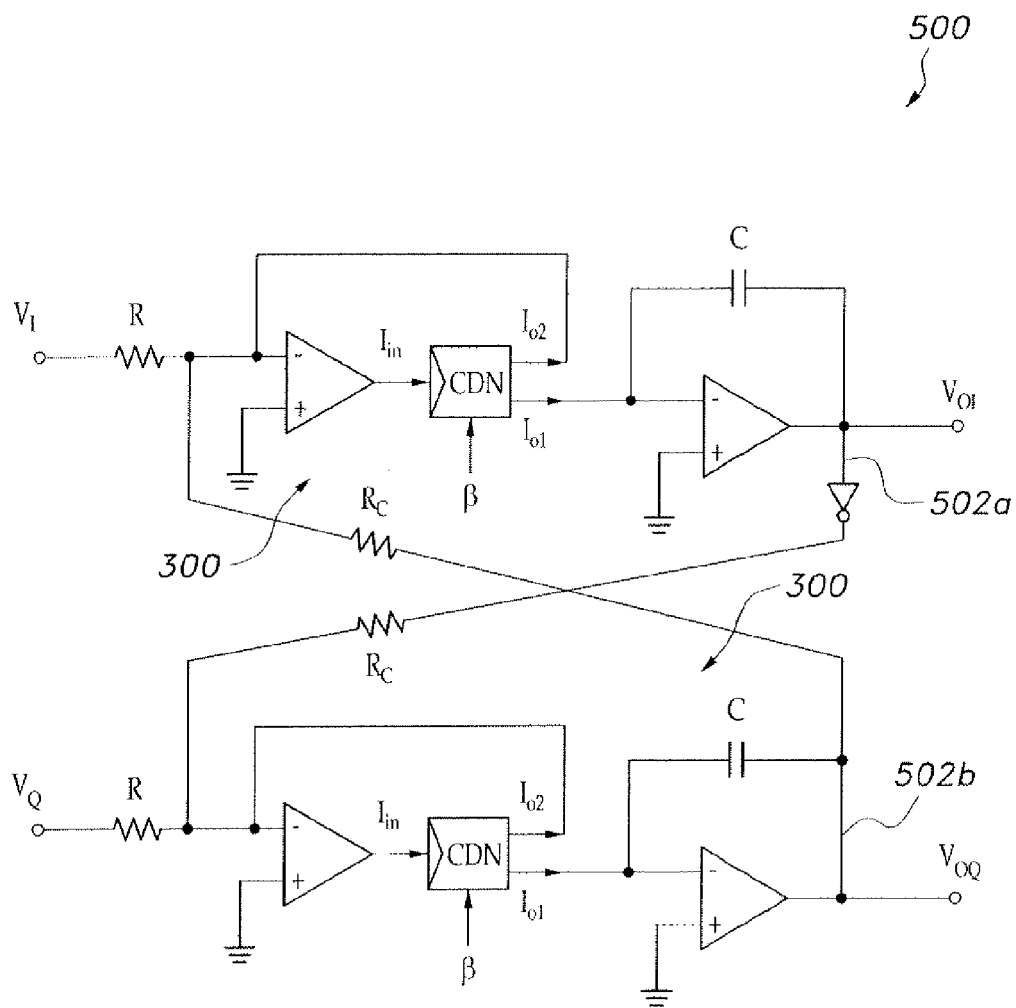
FIG. 5 is a schematic diagram of a second embodiment of a digitally programmable active-RC polyphase filter according to the present invention, featuring a complex lossless integrator circuit using the circuit of FIG. 3.

The effects of the finite and frequency-dependent op-amp gain $A(s)=\omega_t/j\omega$, where $\omega_t$ is the unity gain frequency, on the operation of the filters of FIG. 3 and FIG. 5 are explored. The non-ideal transfer function of the integrator of FIG. 3 can be expressed after neglecting terms involving $A^2(s)$ as follows:

$$\frac{V_o(j\omega)}{V_i(j\omega)} = \left[j\omega\frac{CR}{\beta}\left(1 + \frac{1}{CR_2\omega_t}\right) - \frac{2\omega^2 CR}{\beta\omega_t} - \frac{\omega^2 Cr_{CDN2}}{\beta\omega_t}\right]^{-1} \quad (15)$$

where $r_{CDN2}$ is the small signal resistance of the part of the CDN used in feedback. Assuming that $1/(\omega_t CR_2) \ll 1$ gives:

$$\frac{V_o(j\omega)}{V_i(j\omega)} = \left[j\omega\frac{CR}{\beta} - \frac{2\omega^2 CR}{\beta\omega_t} - \frac{\omega^2 Cr_{CDN2}}{\beta\omega_t}\right]^{-1} \quad (16)$$

$$H_C(s) = \frac{\beta_1\beta_2/(C_1 C_2 R_1 R_3)}{(s - j\omega_{c1})(s - j\omega_{c2}) + (s - j\omega_{c2})\beta_1/(C_1 R_2) + \beta_1\beta_2/(C_1 C_2 R_3 R_4)} \quad (17)$$

-continued $$H_C(s) = \frac{\beta^2/(C^2 R_1 R_3)}{(s - j\omega_c)^2 + (s - j\omega_c)/\beta/(CR_2) + \beta^2/(C^2 R_3 R_4)} \quad (18)$$

Therefore, it can be shown that the integrator parasitic pole will be at $s=-\omega_t/(2+r_{CDN2}/R)$. Selecting $r_{CDN1}=R$ by proper sizing of the transistors of the CDNs leads to a parasitic pole at $s=-\omega_t/3$.

In addition, it can be shown that the non-ideal transfer function of the complex integrator can be expressed as by equation (17), given above. For $1/(\omega_t CR_2) \ll 1$, equation (17) reduces to equation (18), also given above. This shows that the complex integrator acquired a parasitic pole at $s=-\omega_t/(2+rR_1/R+R_1/R_c)$.

The effects of the finite A(s) on the filter frequency response is explored by rewriting the lossy integrator characteristics (18) as:

$$H_{CI}(s) = \frac{1}{(s - j\omega_c)\tau + q} \quad (19)$$

where q is the error caused by non-ideal op-amps, and is given by:

$$q = -\left(\frac{2\omega^2 CR}{\beta\omega_t} + \frac{\omega^2 CR_1}{\beta\omega_t} + \frac{\omega^2 CR_1 R}{\beta\omega_t R_c}\right) \quad (20)$$
$$= -\frac{2\omega CR + \omega CR_1 + \omega CR_1 R/R_c}{\beta|A(j\omega)|}$$

Fortunately, the pole frequency of the complex filter is eleven times less than its counterpart of the normal lowpass filter, and hence the increase in the error due to $R_c$ is somehow neutralized (i.e., when the pole frequency is higher, q is relatively lower). Using the above relation, analysis of the filter circuit shows that no new parasitic poles or zeros are introduced. However, the filter parameters are slightly altered. The non-ideal parameters are given by:

$$\omega_{c(non-ideal)} \approx \omega_c \quad (21)$$

$$\omega_{o(non-ideal)} \approx \omega_o \left[1 + \frac{1}{2}\left(q_1 q_2 + \frac{q_2}{Q_o}\right)\right] \quad (22)$$

$$Q_{non-ideal} \approx \frac{Q_o}{1 + Q_o(q_1 + q_2)} \quad (23)$$

$$H_{non-ideal} \approx \frac{H_o}{Q_o(1 + q_1 q_2 + q_2/Q_o)} \quad (24)$$

The error in the pole frequency will be compensated via proper tuning. However, the errors in the quality factor and gain increase as $\omega_o$, or equivalently, q increases. This error can be neglected, so long as the unity gain frequency of the op-amps is much more than the pole frequency of the filter.

The modulated BT (Bluetooth) signal has a bandwidth of 1 MHz. The center frequency is selected to be 2 MHz. The bandwidth of 802.11b depends on the data rate, which is assumed to be 5.5 Mb/s. Unlike a Chebyshev approximation, a Butterworth function satisfies the in-band group delay requirement of 1 µs needed to eliminate inter-symbol distortion. Also, BT specifies that the filter must attenuate blocker one, two, and three by at least 0 dB, 30 dB, and 40 dB, respectively. WLAN requires adjacent channel rejection of 35 dB at 25 MHz. These requirements are fulfilled through using a fourth-order Butterworth response.

Compensating for about ±30% change in the value of RC products requires center frequency tuning of the complex filter from 1.4 MHz to 2.6 MHz for BT, and pole frequency tuning ranges of about 3.85 MHz to 7.15 MHz for 802.11b mode. But tuning to of the complex filter must be combined with equivalent pole frequency tuning from 350 kHz to 650 kHz to maintain a constant ratio between the center frequency and the bandwidth of the complex filter. This is required such that when the center frequency is tuned to its nominal value, the bandwidth of the filter is automatically adjusted. The ratio between the maximum and minimum pole frequency is about 20.5, which can be covered with the 8-bit CDNs using digital words '43' through '206', or equivalently, β of 0.2028 through 4.2041.

Figure 8:
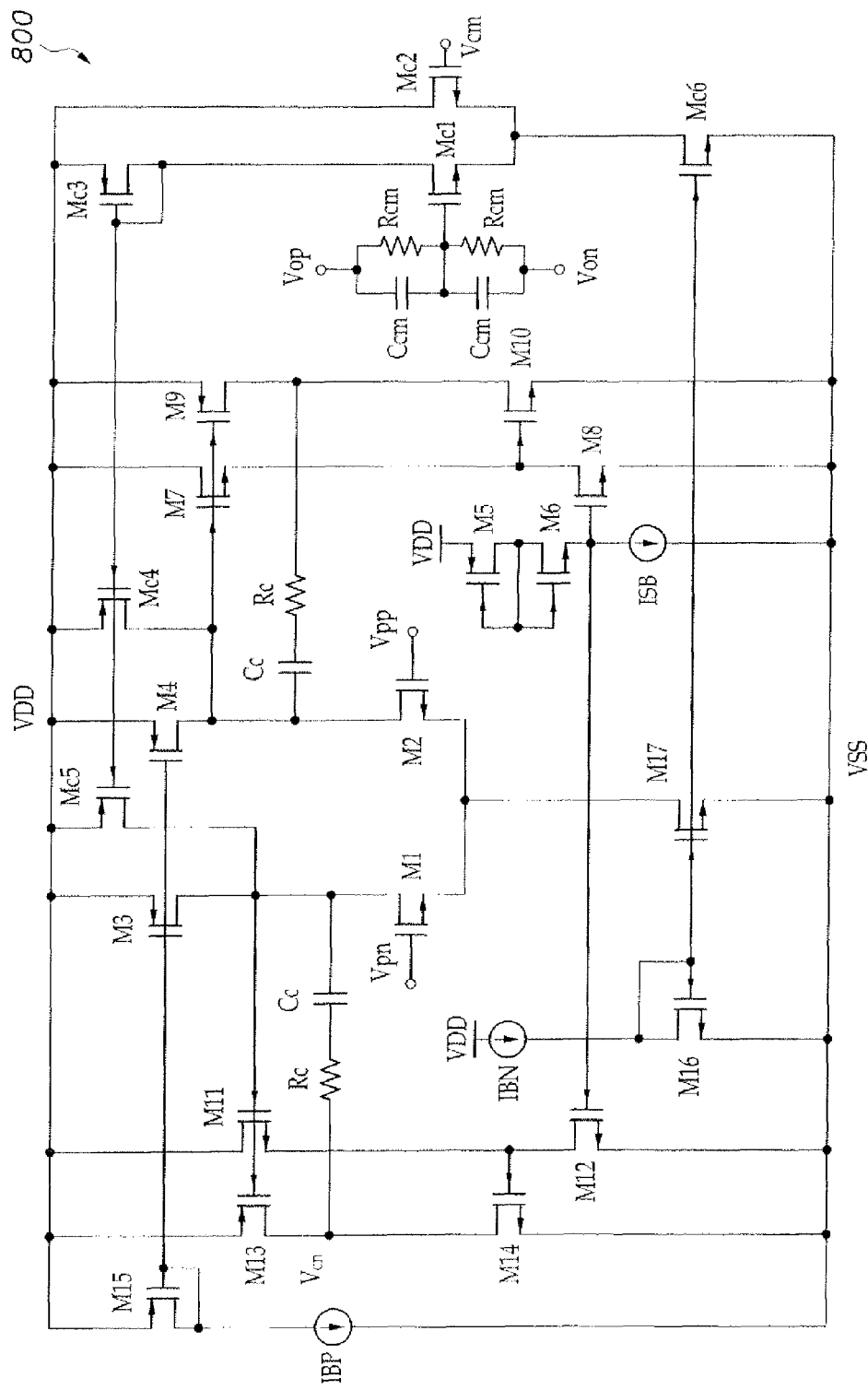
FIG. 8 is a schematic diagram of a fully differential class AB op amp.

When an op-amp is intended to be used in non-inverting configuration, class AB or rail-to-rail input stage is needed. But if the use of the op-amps is restricted to the inverting configuration, as in the proposed filter, a single differential pair can be adapted as an input stage. The output stage adopts class AB operation for low power consumption, as well as for high current driving capabilities. A fully differential op-amp circuit 800 is shown in FIG. 8. A classical common mode feedback (CMFB) circuit, consisting of transistors Mc1-Mc6 in addition to two resistors (Rcm) and two capacitors (Ccm), is employed. Transistors M7-M8 and M11-M12 are used as level shifters for the gain stage M9-M10 and M13-M14, respectively. Transistors M5 and M6 are used for standby current biasing.

A fourth-order filter is developed by cascading two sections of FIG. 7. CDNs with 8-bits are used for mode switching, as well as for channel selection. The supply voltages were ±0.9V, and the total standby was approximately 3 mA.

The frequency responses show center frequency tuning from 1.4 MHz to 2.7 MHz. The attenuations at 4 MHz and 5 MHz blockers are found to be 44 dB and 58 dB, respectively. An image rejection ratio (IRR) of about than 52 dB is accomplished. The input third-order intercept point (IIP3) for in-band, out-of-band near, and distant blockers results are obtained using two testing tones at 1.9 MHz and 2.1 MHz, 3 MHz and 4 MHz, and 5 MHz and 8 MHz, respectively. IIP3 are found to be 31 dBm, 40 dBm, and 47 dBm, respectively. The total in-band output noise of the filter is found to be less than −61.7 dBm. These values lead to an in-band SFDR (defined as SFDR=2(IIP3-input noise)/3) of 69.8 dB.

Measured responses of the filter when configured as a lowpass filter demonstrate tuning of the bandwidth from approximately 3.85 MHz to 7.15 MHz. At the nominal frequency setting, the attenuation at 25 MHz was found to be more than 50 dB.

The IIP3 was determined by performing several IM3 tests using 3 MHz and 4 MHz signals. IIP3 estimation for in-band signals was found to be 38 dBm. In this configuration, the linearity is improved because there are no switches in the signal path. The total in-band output noise for the lowpass filter is found to be less than −56.5 dBm over a bandwidth of 5.5 MHz. These values lead to an in-band SFDR of 71 dB.

A new approach introducing programmability features to active RC two-integrator loop filter topologies has been presented. The proposed technique is based on a digitally controlled CDN, which achieves a wide frequency tuning range without component spreading while preserving the inherently high linearity properties of the CDN. The digitally programmable active-RC filter 300 provides wider tuning range and more precise tuning resolution, accompanied by better linearity and/or reduced area compared with the conventional active-RC filters. In addition, it has been shown that noise performance of the proposed approach is comparable with its counterpart of the RC banks. The main drawback of the proposed approach is the power consumption due to the use of two op-amps per integrator. This is similar to the case of a MOSFET-C approach, where an extra op-amp is also needed to cancel even and odd non-linearity. But the proposed approach has the advantages of better linearity and much wider tuning range, particularly for low supply voltages. Experimental results demonstrate pole frequency tuning range from 350 kHz to 7.15 MHz. Experimental results obtained from a $4^{th}$-order lowpass filter show in-band IIP3 of 38 dBm and SFDR of 71 dB for the case of 5.5 MHz bandwidth. When it is configured as a complex filter with a bandwidth of 1 MHz, it achieves IRR of better than 52 dB and in-band SFDR of 69.8 dB. Utilization of this approach in designing channel select filters for digital video broadcasting-handheld (DVB-H) receivers is also contemplated.

It is to be understood that the present invention is not limited to the embodiments described above, but encompasses any and all embodiments within the scope of the following claims.

I claim:

1. A digitally programmable active-RC filter, comprising at least one dual op-amp integrator having:
    a first differential op-amp having a first differential op-amp inverting input, a first differential op-amp non-inverting input, and a first differential op-amp differential output;
    a first resistor having a first lead connected to the first differential op-amp inverting input;
    a second resistor having a first lead connected to the first differential op-amp non-inverting input, the first and second resistors having second leads adapted for accepting a first differential input voltage;
    a second differential op-amp having a second differential op-amp inverting input, a second differential op-amp non-inverting input, and a second differential op-amp differential output;
    a first capacitor connected between the second differential op-amp inverting input and a positive portion of the second differential op-amp differential output;
    a first feedback resistor connected between the positive portion of the second differential op-amp differential output and the non-inverting input of the first differential operational amplifier;
    a second capacitor connected between the second differential op-amp non-inverting input and a negative portion of the second differential op-amp differential output;
    a second feedback resistor connected between the negative portion of the second differential op-amp differential output and the inverting input of the first differential operational amplifier;
    a first CDN having a current input, a first current output, a second current output, and a digital control input, the current input of the first CDN being connected to a positive portion of the first differential op-amp output, the first current output of the first CDN being connected to the second differential op-amp inverting input, the second current output of the first CDN being connected to the first differential op-amp inverting input;
    a second CDN having a current input, a first current output, a second current output, and a digital control input, the current input of the second CDN being connected to a negative portion of the first differential op-amp differential output, the first current output of the second CDN being connected to the second differential op-amp non-inverting input, the second current output of the second CDN being connected to the first differential op-amp non-inverting input; and
    wherein binary digital control words applied to the digital control inputs of the first and second CDNs adjust frequency response characteristics of the digitally programmable active-RC filter.

2. The digitally programmable active-RC filter according to claim 1, wherein:
    said at least one dual op-amp integrator comprises first, second, third, and fourth dual op-amp integrators, the second dual op-amp integrator having its third feedback resistor connected between its inverting output and the inverting input of the first differential op-amp and having its fourth feedback resistor connected between its non-inverting output and the non-inverting input of the first differential op-amp, the fourth dual op-amp integrator having its fifth feedback resistor connected between its inverting output and the inverting input of the third differential op-amp and having its sixth feedback resistor connected between its non-inverting output and the non-inverting input of the third differential op-amp;
    the differential input of the second dual op-amp integrator is connected to the differential output of the first dual op-amp integrator;
    the differential input of the fourth dual op-amp integrator is connected to the differential output of the third dual op-amp integrator;
    the differential output of the first dual op-amp integrator has a switchable cross-coupling branch to the differential input of the third dual op-amp integrator;
    the differential output of the third dual op-amp integrator has a switchable cross-coupling branch to the differential input of the first dual op-amp integrator;
    the differential output of the second dual op-amp integrator has a switchable cross-coupling branch to the differential input of the fourth dual op-amp integrator; and
    the differential output of the fourth dual op-amp integrator has a switchable cross-coupling branch to the differential input of the second dual op-amp integrator.

3. The digitally programmable active-RC filter according to claim 2, further comprising means for opening said switchable cross-coupling branches, thereby configuring said dual op-amp integrators for accepting and passing through WIFI 802.11 signals.

4. The digitally programmable active-RC filter according to claim 2, further comprising means for closing said switchable cross-coupling branches, thereby configuring said dual op-amp integrators for accepting and passing through bluetooth signals.

5. The digitally programmable active-RC filter according to claim 4, wherein said first dual op-amp integrator differential input accepts an in-phase voltage signal and said second dual op-amp integrator differential output provides an in-phase voltage output signal, said third dual op-amp integrator differential input accepts a quadrature voltage signal, and said fourth dual op-amp integrator differential output provides a quadrature voltage output signal.

* * * * *